United States Patent [19]
Takano et al.

[11] Patent Number: 5,216,634
[45] Date of Patent: Jun. 1, 1993

[54] SEMICONDUCTOR MEMORY DEVICE

[75] Inventors: Tsuneo Takano; Masaru Uesugi, both of Tokyo, Japan

[73] Assignee: Oki Electric Industry Co., Ltd., Tokyo, Japan

[21] Appl. No.: 647,441

[22] Filed: Jan. 29, 1991

[30] Foreign Application Priority Data

Jan. 29, 1990 [JP] Japan .................................. 2-18253

[51] Int. Cl.$^5$ ............................................ G11C 11/40
[52] U.S. Cl. ...................................... 365/205; 365/207
[58] Field of Search ....................... 365/205, 207, 149

[56] References Cited

U.S. PATENT DOCUMENTS

| | | | |
|---|---|---|---|
| 4,239,993 | 12/1980 | McAlexander, III et al. | 365/205 X |
| 4,451,906 | 5/1984 | Ikeda | 365/205 |
| 4,476,547 | 10/1984 | Miyasaka | 365/205 |
| 4,780,852 | 10/1988 | Kajigaya | 365/205 X |
| 4,791,616 | 12/1988 | Taguchi et al. | 365/205 |
| 5,029,330 | 7/1991 | Kajigaya | 365/207 X |

FOREIGN PATENT DOCUMENTS 0344752 12/1989 European Pat. Off. .

OTHER PUBLICATIONS

H. Shimada et al., "A 46-ns 1 Mbit CMOS SRAM", *Journal of Solid-State Circuits*, vol. 23, No. 1, pp. 53-58 (Feb., 1988).

*Primary Examiner*—Eugene R. LaRoche
*Assistant Examiner*—Do Hyun Yoo
*Attorney, Agent, or Firm*—Edward D. Manzo; Mark J. Murphy

[57] ABSTRACT

A semiconductor memory device has pairs of complementary bit lines connected to pairs of complementary data bus lines via transfer elements controlled by column lines. The bit lines are arranged so that mutually adjacent pairs of bit lines are connected to the same pair of data bus lines at a pair of common nodes. The transfer elements for each such mutually adjacent pair of bit lines are controlled by different column lines.

18 Claims, 5 Drawing Sheets

SEMICONDUCTOR MEMORY DEVICE

BACKGROUND OF THE INVENTION

This invention relates to a semiconductor memory device, more specifically to the arrangement of its bit lines and their connections to the data bus.

A semiconductor memory device has a memory cell array from which bit lines carry data to sense amplifiers, which place amplified data on an internal data bus. The bit lines and data bus lines are actually complementary pairs of lines, one carrying the data value and the other the inverse of that value.

Modern semiconductor memory devices are frequently subdivided into two or more memory cell arrays, each with separate bit lines and sense amplifiers which may be shared by adjacent memory cell arrays, and have two or more pairs of data bus lines. Interconnections between the bit lines and data bus lines are controlled by switching elements, called transfer means, that operate in response to column signals. In a device with two pairs of data bus lines, for example, each column signal selects two pairs of bit lines, connecting one bit line pair to one data bus pair, and the other bit line pair to the other data bus pair.

In the prior art, the bit line pairs are laid out in an order that alternates between one data bus line and the other. This scheme permits the two bit line pairs selected by the same column signal to be disposed side by side, but has the disadvantage that each bit line must be connected to the data bus at a separate node. This imposes a limitation to the reduction in the bit line pitch, and hence to the increase in the degree of integration.

SUMMARY OF THE INVENTION

It is accordingly an object of the present invention to enable further reduction in the bit line pitch, and hence increase in the degree of integration.

A semiconductor memory device comprises at least two pairs of data bus lines, at least four pairs of bit lines oriented perpendicular to the data bus lines, and at least two column lines. Each pair of bit lines is connected to a sense amplifier and a transfer means. The transfer means connect mutually adjacent pairs of bit lines to the same pair of data bus lines at a pair of common nodes. The two transfer means for each such mutually adjacent pair of bit lines are controlled by different column lines.

DETAILED DESCRIPTION OF THE PREFERRED EMBODIMENTS

A semiconductor memory device with a novel arrangement of bit lines, their connections with data bus lines, and other elements will be described with reference first to circuit diagrams in FIG. 1 and FIG. 2, then to an actual layout diagrams in FIG. 3A to FIG. 3C. The semiconductor memory device shown will be a dynamic random access memory (RAM). The drawings depict one embodiment of the invention but do not restrict its scope, which should be judged from the appended claims.

Figure 1:
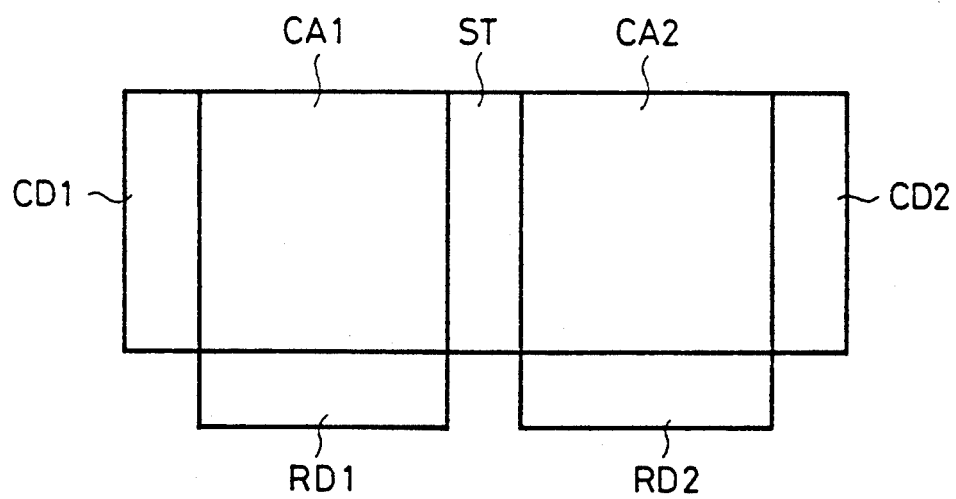
FIG. 1 is a schematic diagram showing a memory device comprising two memory cell arrays with a block of sense amplifiers and transfer transistors interposed between the two memory cell arrays.

FIG. 1 shows a memory device which comprises a pair of memory cell arrays CA1 and CA2 each consisting of memory cells arranged in row and columns to form a matrix, a block ST of sense amplifiers and transfer transistors, first and second row decoders RD1 and RD2, and first and second column decoders CD1 and CD2. The sense amplifiers are shared by the two memory cell arrays CA1 and CA2.

Figure 2:
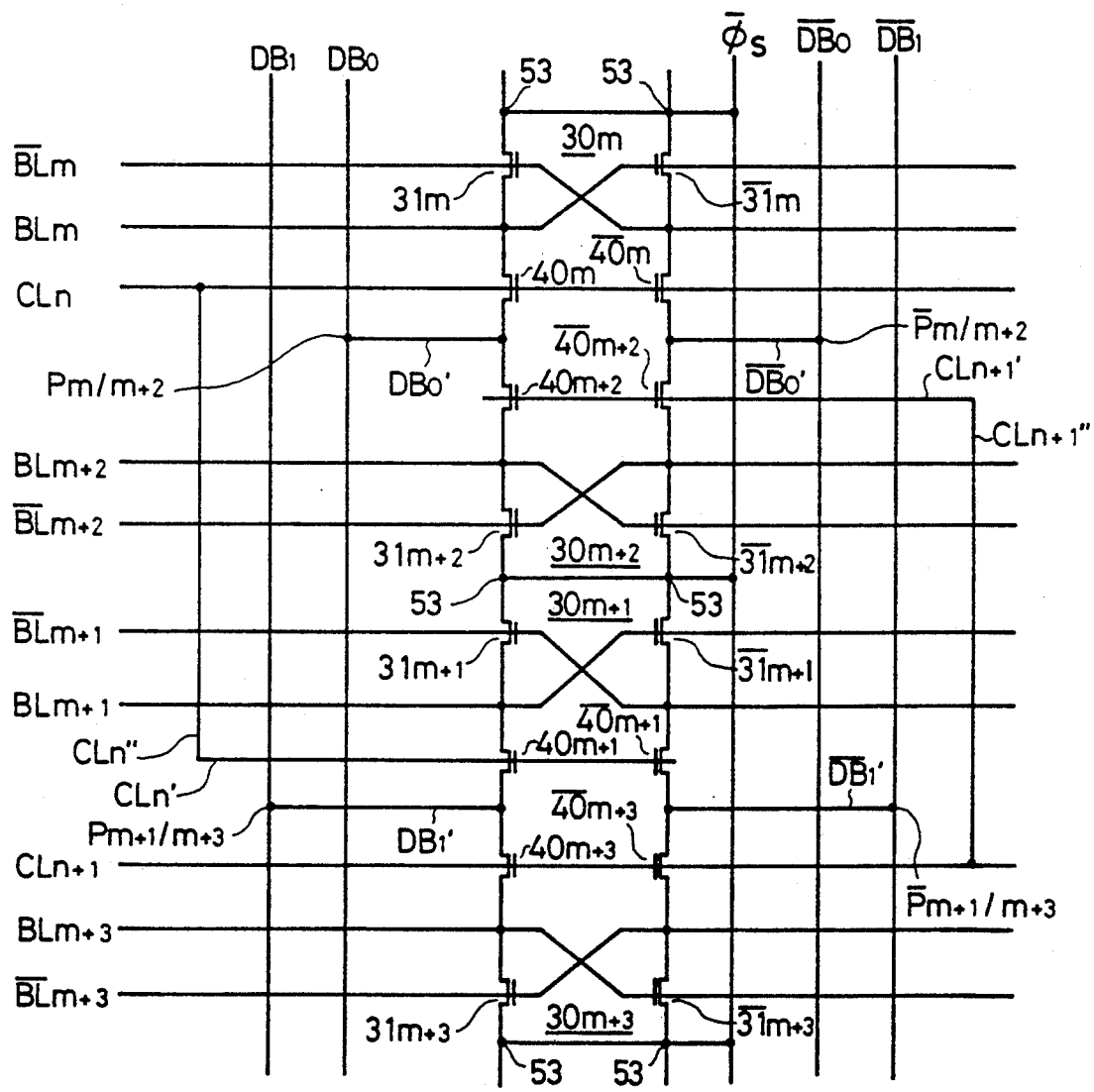
FIG. 2 is a circuit diagram illustrating the pertinent portion of the memory device of FIG. 1.

FIG. 2 is a circuit diagram showing electrical connection of sense amplifiers, transfer transistors, and related components. FIG. 2 shows four sense amplifiers $30_m$, $30_{m+1}$, $30_{m+2}$, and $30_{m+3}$ and their associated circuit lines.

Each of the sense amplifiers $30_m$ to $30_{m+3}$ comprises a pair of first and second NMOS transistors $31_x$ and $31_x$ (x=m, m+1, m+2, or m+3). A bit line $BL_x$ (x=m, m+1, m+2 or m+3) is connected to the drain of the first NMOS transistor $31_x$, and the gate of the second NMOS transistor $31_x$. A complementary bit line $\overline{BL}_x$ is connected to the drain of the second NMOS transistor $31_x$, and the gate of the first NMOS transistor $31_x$. The sources of the NMOS transistors $31_x$ and $31_x$ are connected to a common sense clock $\phi_S$) line.

The function of the sense clock line ($\phi_S$ is to activate the sense amplifier $30_x$. When the clock line $\phi_S$ is driven active, the small potential difference between the BL and $\overline{BL}$ lines is amplified so that one of these bit lines is pulled up to the logic 1 level while the other is pulled down to the logic 0 level.

The sense amplifiers $30_m$, ... $30_{m+3}$ are connected to pairs of bit lines ($BL_m$, $\overline{BL}_m$), ... ($BL_{m+3}$, $\overline{BL}_{m+3}$) having matching subscripts. The common clock line $\phi_S$, which is connected to all the sense amplifiers $30_m$, ..., $30_{m+3}$, crosses the bit lines $BL_x$ and $\overline{BL}_x$ (x=m, ..., m+3) at right angles. The bit line pairs are arranged in the order ($BL_m$, $\overline{BL}_m$), ($BL_{m+2}$, $\overline{BL}_{m+2}$), ($BL_{m+1}$, $\overline{BL}_{m+1}$), ($BL_{m+3}$, $\overline{BL}_{m+3}$). The effect of the invention depends on the order of the pairs, but not on the order of the two bit lines within each pair.

Each pair of bit lines ($BL_x$, $\overline{BL}_x$) is connected to a column of memory cells in a memory cell array. When the memory device is read, one of the memory cells in the column is selected by means of a word line (not shown as such) and a row decoder RD1 and RD2, and the data value stored in the selected memory cell appears as a slight potential difference between the bit lines $BL_x$ and $\overline{BL}_x$. This potential difference is amplified by the sense amplifier $30_x$ as described above.

A column line $CL_n$ is disposed between the bit line pairs ($BL_m$, $\overline{BL}_m$) and ($BL_{m+2}$, $\overline{BL}_{m+2}$). Another column line $CL_{n+1}$ is disposed between the bit line pairs ($BL_{m+1}$, $\overline{BL}_{m+1}$) and ($BL_{m+3}$, $\overline{BL}_{m+3}$). An auxiliary line $CL_n'$ connected by bridging line $CL_n''$ is disposed between the bit line pairs ($BL_{m+1}$, $\overline{BL}_{m+1}$) and ($BL_{m+3}$, $\overline{BL}_{m+3}$). Another auxiliary line $CL_{n+1}'$ connected to a bridging line $CL_{n+1}''$ is disposed between the bit line pairs ($BL_m$, $\overline{BL}_m$) and ($BL_{m+2}$, $\overline{BL}_{m+2}$).

As transfer means, the device in FIG. 2 has transfer transistors comprising NMOS transistors $40_m$, $40_m$, ..., $40_{m+3}$, $40_{m+3}$. The purpose of the transfer means is to connect the bit lines $BL_m$, $\overline{BL}_m$, ..., $BL_{m+3}$, $\overline{BL}_{m+3}$ and sense amplifiers $30_m$, ..., $30_{m+3}$ to pairs of complementary data bus lines ($DB_0$, $\overline{DB}_0$) and ($DB_1$, $\overline{DB}_1$), disposed perpendicular to the bit lines. The transfer means are controlled by the column lines, together with the auxiliary lines, so that only one pair of bit lines is connected to a given pair of data bus lines at a time. Accordingly, transfer means that connect different bit lines to the same data bus line are controlled by different column lines.

The transfer transistor $40_m$ is connected at its source to the bit line $BL_m$ and the sense amplifier $30_m$. In like manner, the sources of the transfer transistors $40_m, \ldots, 40_{m+3}, 40_{m+3}$ are connected to bit lines $\overline{BL}_m, \ldots, BL_{m+3}, \overline{BL}_{m+3}$ and sense amplifiers $30_m, \ldots, 30_{m+3}$ with matching subscripts. The gate electrodes of the transfer transistors $40_m$ and $40_m$ are connected directly to the column line $CL_n$. The gate electrodes of the transfer transistors $40_{m+1}$ and $40_{m+1}$ are connected to the column line $CL_n$ via auxiliary line $CL_n'$. The gate electrodes of the transfer transistors $40_{m+2}$ and $40_{m+2}$ are connected to the column line $CL_{n+1}$ via auxiliary line $CL_{n+1}'$. The gate electrodes of the transfer transistors $40_{m+3}$ and $40_{m+3}$ are connected directly to the column line $CL_{n+1}$.

The drains of the transfer transistors $40_m$ and $40_{m+2}$ are connected to the data bus line $DB_0$ at the common node $P_{m/m+2}$. The transfer transistors $40_m$ and $40_{m+2}$ therefore connect the data bus line $DB_0$ to the bit line $BL_m$ when the column line $CL_n$ is driven active, and to the bit line $BL_{m+2}$ when the column line $CL_{n+1}$ is driven active. Similarly, the transfer transistors $40_m$ and $40_{m+2}$ connect the data bus line $\overline{DB}_0$ to the bit line $\overline{BL}_m$ or $\overline{BL}_{m+2}$ at the common node $\overline{P}_{m/m+2}$, the transfer transistors $40_{m+1}$ and $40_{m+3}$ connect the data bus line $DB_1$ to the bit line $BL_{m+1}$ or $BL_{m+3}$ at the common node $P_{m+1/m+3}$, and the transfer transistors $40_{m+1}$ and $40_{m+3}$ connect the data bus line $\overline{DB}_1$ to the bit line $\overline{BL}_{m+1}$ or $\overline{BL}_{m+3}$ at the common node $\overline{P}_{m+1/m+3}$.

In a write operation in which the column line $CL_n$ is driven active and the column line $CL_{n+1}$ is driven inactive, data are transferred from the data bus pairs ($DB_0$, $\overline{DB}_0$) and ($DB_1$, $\overline{DB}_1$) via the common nodes $P_{m/m+2}$, $\overline{P}_{m/m+2}$, $P_{m+1/m+3}$, and $\overline{P}_{m+1/m+3}$ and the transfer transistors $40_m$, $40_m$, $40_{m+3}$, and $40_{m+3}$ to the sense amplifiers $30_m$ and $30_{m+3}$, respectively. The transferred data are written via the bit line pairs ($BL_m$, $\overline{BL}_m$) and ($BL_{m+3}$, $\overline{BL}_{m+3}$) to memory cells selected by a row decoder RD1 and RD2.

A semiconductor memory device normally has many more bit lines and column lines than shown in the drawing. The other lines can be arranged in a fashion analogous to FIG. 2, with two bit lines connected to each data bus line at a common node. In the above described arrangement, adjacent pairs of transfer transistors $40_m$ and $40_m$; and $40_{m+2}$, $40_{m+2}$ are connected through common nodes to the data bus line pair $DB_0$ and $\overline{DB}_0$. Similarly, adjacent pairs of transfer transistors $40_{m+1}$ and $40_{m+1}$; and $40_{m+3}$, $40_{m+3}$ are connected through common nodes to the data bus line pair $DB_1$ and $\overline{DB}_1$. Accordingly, each data bus line needs only to be connected via a contact hole to the transfer transistor at every four pairs of bit lines. This is in contrast to the prior art scheme in which each data bus line needs to be connected via a contact hole to the transfer transistor at every two pairs of bit lines. The reduction in the number of contact holes for connection with the data bus lines with the transfer transistors enables reduction in the bit line pitch, and hence increase in the degree of integration. Fuller understanding will be had from the following description made with reference to the FIG. 3A to FIG. 3C showing layouts of the respective layers forming the transistors and interconnections of FIG. 2.

Figure 3A:
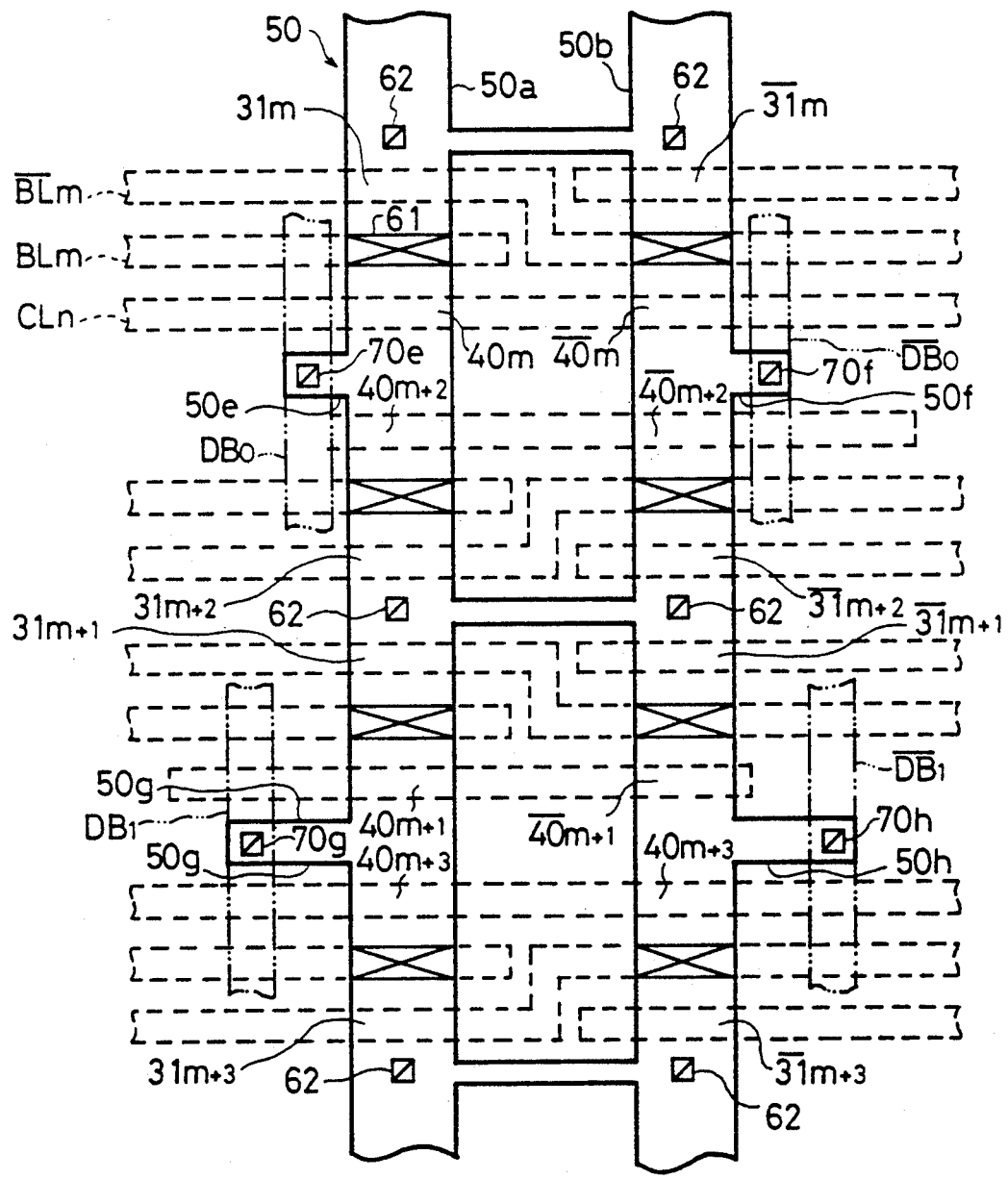
FIG. 3A, FIG. 3B and FIG. 3C are layout diagrams illustrating respective layers of the pertinent portion of the memory device of FIG. 1.

FIG. 3A shows, in solid lines, active regions 50 formed in the semiconductor substrate, and is comprised of doped semiconductor regions, and shows, in broken lines, polysilicon layers, and part of metal layers, in phantom lines.

Figure 3B:
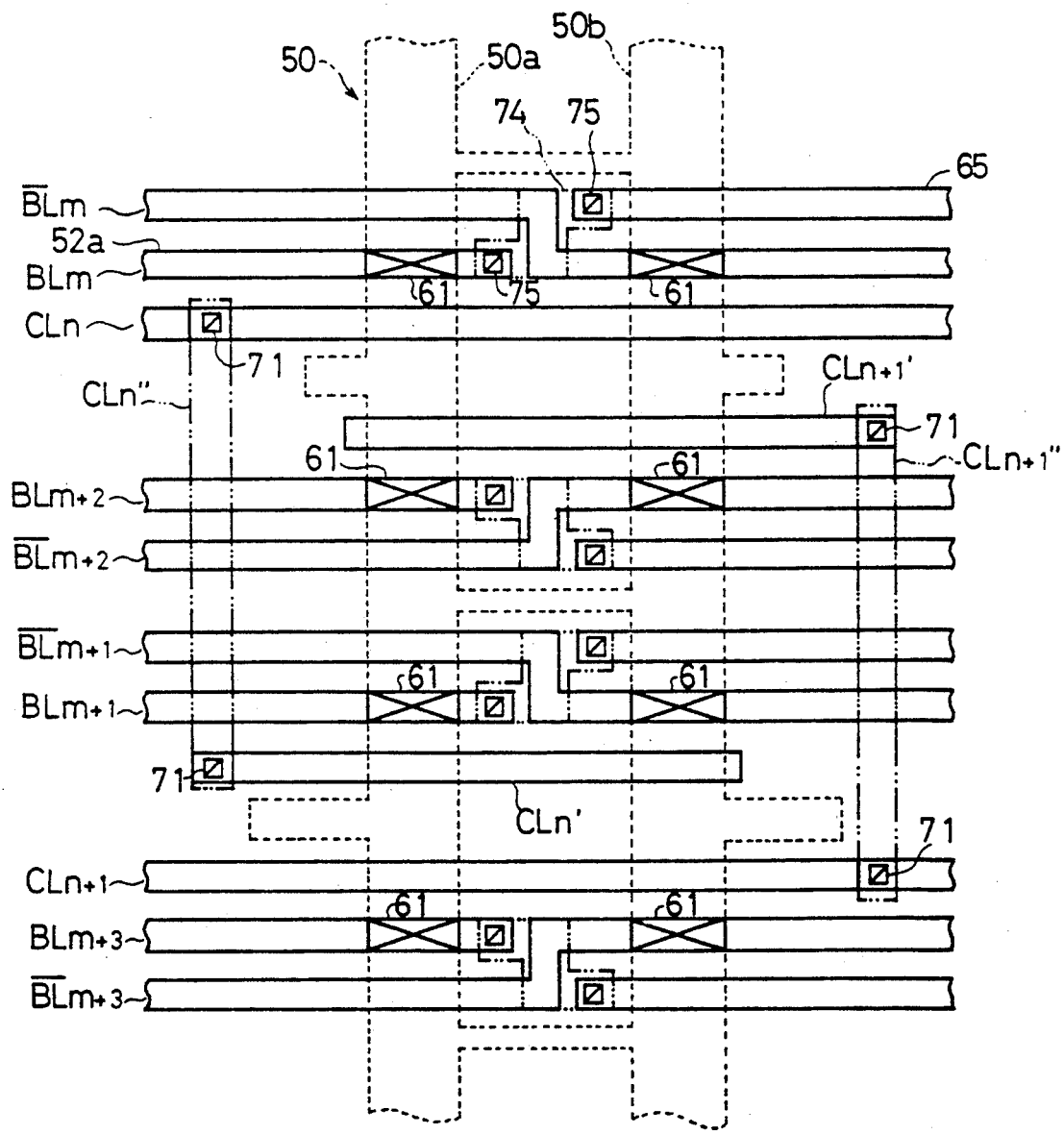

FIG. 3B shows, in solid lines, polysilicon layers forming the bit lines $BL_m$, $\overline{BL}_m$, $BL_{m+2}$, $\overline{BL}_{m+2}$, $BL_{m+1}$, $\overline{BL}_{m+1}$, $BL_{m+3}$, $\overline{BL}_{m+3}$, column lines $CL_n$, and $CL_{n+1}$, and auxiliary lines $CL_n'$ and $CL_{n+1}'$. FIG. 3B also shows, in dotted lines, the active regions 50, and part of the metal layers in phantom lines.

Figure 3C:
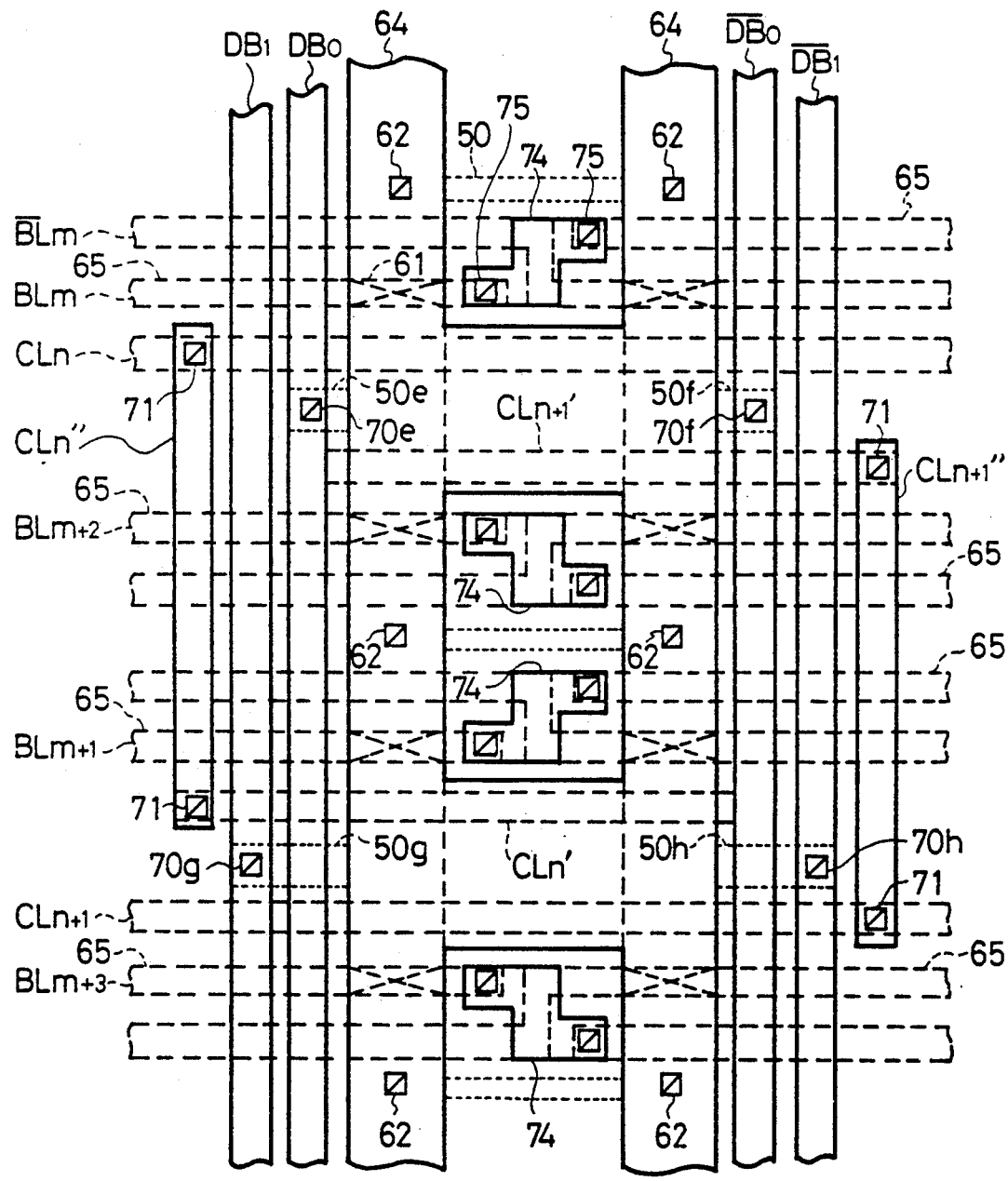

FIG. 3C shows, in solid lines, metal layers forming data bus lines $DB_0$, $\overline{DB}_0$, $DB_1$, and $\overline{DB}_1$, clock line $\phi_S$ 64, bridging lines $CL_n''$ and $CL_{n+1}''$ for connecting the auxiliary lines $CL_n'$ and $CL_{n+1}'$ to the column lines $CL_n$ and $CL_{n+1}$, and bridging lines 74 for connecting pieces 65 of bit lines $BL_m$, $BL_{m+1}$, $BL_{m+2}$, and $BL_{m+3}$ at portions where the bit lines pairs are "twisted", or where the bit lines of each pair are positionally exchanged for forming a flip-flop type sense amplifier. FIG. 3C also shows, in broken lines, the polysilicon layers, and the active regions in dotted lines.

As shown in FIG. 3A, FIG. 3B and FIG. 3C, the bit lines are connected to the junction regions of the active regions 50 by means of junction-polysilicon ohmic contacts 61, which extend through the contact holes.

As shown in FIG. 3A and FIG. 3C, the clock line 64 is connected to the junction regions 50 by means of junction-metal contacts 62 extending through contact holes.

The metal bridging lines 74, shown in solid lines in FIG. 3C and in broken lines in FIG. 3B, are connected to the polysilicon bit lines $BL_x$ by metal-polysilicon contacts 75 extending through contact holes.

The bridging lines $CL_n''$ and $CL_{n+1}''$, shown in solid lines in FIG. 3C and in broken lines in FIG. 3B, are connected to the polysilicon column lines $CL_n$ and $CL_{n+1}$ and the polysilicon auxiliary lines $CL_n'$ and $CL_{n+1}'$, by means of polysilicon-metal contacts 71 extending through contact holes.

As shown in FIG. 3C as well as in FIG. 3A, the active regions 50 includes first and second main parts 50a and 50b extending in parallel with the data bus lines, and parts lateral projections 50e, 50f, 50g and 50h which extend laterally, i.e., in the direction of bit lines, from the first and second main parts 50a and 50b of the active region 50 at locations adjacent the drains of the transfer transistors, to form the data bus line interconnections $DB_0'$, $\overline{DB}_0'$, $DB_1'$ and $\overline{DB}_1'$ (FIG. 2) which are connected to the data bus lines $DB_0$, $\overline{DB}_0$, $DB_1$ and $\overline{DB}_1$ by means of contacts 70e, 70f, 70g, 70h extending through contact holes, thereby to form the common nodes $P_{m/m+2}$, $\overline{P}_{m/m+2}$, $P_{m+1/m+3}$ and $\overline{P}_{m+1/m+3}$.

Transistors $31_m, \ldots, 31_{m+3}$ forming the transfer means are formed where the bit lines $\overline{BL}_x$ cross the first main part 50a of the active region. Transistors $31_m, \ldots, 31_{m+3}$ forming the transfer means are formed where the bit lines $BL_x$ cross the second main part 50b of the active region. Transfer transistors $40_m, \ldots, 40_{m+3}$ are formed where the column lines $CL_n$ and $CL_{n+1}$ cross the first main part 50a of the active region 50. Transfer transistors $40_m, \ldots, 40_{m+3}$ are formed where the column lines $CL_n$ and $CL_{n+1}$ cross the second main part 50b of the active region 50. The lateral projections 50e to 50h are disposed at points intermediate between these transfer transistors.

Where there are more than four pairs of bit lines, the pattern shown in FIG. 3A to FIG. 3C is repeated. It will be seen that the connection by contacts 70e to 70h between the data bus lines and the transfer transistors $40_x$ and $40_x$ (x=m, m+1, m+2, m+3) are provided each for the four pairs of the bit lines, and each data bus line (e.g., $DB_0$) is connected by the contact hole (70e) to the transfer transistors ($40_m$ and $40_{m+2}$) at every four pairs of bit lines. Thus, the space needed for the contacts (70e, 70f, etc.) is reduced.

In a layout such as the one shown in FIG. 3A to FIG. 3C, it is necessary for the clock ($\phi_S$) contacts 62 to be on opposite sides (in the top-to-bottom direction) of the sense amplifiers $30_m, \ldots, 30_{m+3}$ from the nodes ($P_{m/m+2}$, $\overline{P}_{m/m+2}$, $P_{m+1/m+3}$, and $\overline{P}_{m+1/m+3}$) connecting the sense amplifiers to the data bus lines. The virtue of the novel arrangement is that it enables this condition to be satisfied without requiring a separate node for each interconnection between a data bus line and a bit line via a transfer transistor. It therefore becomes possible to lay out even a high-density VLSI memory with an extremely narrow bit line pitch.

The circuits shown in the drawings can be modified in various ways without departing from the spirit and scope of the invention. For example: the sense amplifiers $30_m$ to $30_{m+3}$ may have circuit configurations differing from FIG. 2; the transfer means may comprise transistors other than the transfer transistors $40_m, 40_m, \ldots, 40_{m+3}$; the transfer means may be connected directly to the sense amplifier nodes; fabrication patterns other than those shown in FIG. 3A to FIG. 3C may be used; and this invention can be applied not only to dynamic RAMs but to other semiconductor memory devices as well, such as static RAMs.

What is claimed is:

1. A semiconductor memory device comprising:
   active regions formed on or in a semiconductor substrate;
   a plurality of interconnected layers formed over the semiconductor substrate;
   at least two pairs of data bus lines located in one of said interconnected layers and generally extending in one direction;
   at least four pairs of bit lines located in one of said interconnected layers and intersecting said data bus lines;
   at least four sense amplifiers connected to respective pairs of bit lines;
   a sense clock line located in one of said interconnected layers and extending generally parallel with said data bus lines;
   each of said sense amplifiers having a node connected to said sense clock line;
   at least two column lines located in one of said interconnected layers and extending generally parallel with said bit lines;
   a plurality of transfer means controlled by said column lines for connecting two mutually adjacent pairs of bit lines to one of said pairs of data bus lines, and two other mutually adjacent pairs of bit lines to another of said pairs of data bus lines;
   auxiliary lines located in one of said interconnected layers and extending generally parallel with said column lines; and
   bridging lines located in one of said interconnected layers and connecting said auxiliary lines to said column lines;
   wherein said active regions comprise a main part extending generally parallel with the data bus lines;
   each of said sense amplifiers comprises a pair of transistors located in said main part of the active regions and having first electrodes connected to said sense clock line, having second electrodes connected to a corresponding pair of bit lines, and having said corresponding pair of bit lines acting as gate electrodes;
   each of said transfer means comprises a pair of transistors located in said main part of the active regions, and having first electrodes connected to a corresponding pair of bit lines and having corresponding column lines acting as gate electrodes;
   said active regions having lateral protrusions extending from said main part for connecting second electrodes of said transistors of said transfer means with said data bus lines;
   the transfer transistors for one of said two mutually adjacent pairs of bit lines connected to said one of said pairs of data bus lines being controlled by one of said column lines; and
   the transfer transistors for one of said two other mutually adjacent pairs of bit lines being controlled by the auxiliary lines connected to said one of the column lines.

2. A semiconductor memory device comprising:
   a first pair of data bus lines extending in a first direction;
   a first pair of bit lines extending in a second direction substantially perpendicular to said first direction;
   a second pair of bit lines, adjacent to said first pair of bit lines and substantially parallel to said first pair of bit lines;
   a first sense amplifier coupled to said first pair of bit lines;
   a second sense amplifier coupled to said second pair of bit lines;
   a first pair of transfer transistors connecting said first pair of bit lines with said first pair of data bus lines; and
   a second pair of transfer transistors connecting said second pair of bit lines with said first pair of data bus lines;
   said first and second pairs of transfer transistors being located between said first and second pairs of bit lines.

3. The device according to claim 2 further comprising first and second column lines, said first column line being coupled to said first pair of transfer transistors and driving said first pair of transfer transistors, and said second column line being coupled to said second pair of transfer transistors and driving said second pair of transfer transistors.

4. The device according to claim 3 wherein said first and second column lines respectively extend substantially parallel to said first pair of bit lines.

5. The device according to claim 2 wherein said first pair of data bus lines include first and second data bus lines which are substantially parallel to each other, and said first and second sense amplifiers and said first and second transfer transistors are located between said first and second data bus lines.

6. The device according to claim 2 wherein said first and second pairs of transfer transistors are located between said first and second sense amplifiers.

7. The device according to claim 2 further comprising:

a second pair of data bus lines extending substantially parallel to said first pair of data bus lines;

a third pair of bit lines extending substantially parallel to said first pair of bit lines;

a fourth pair of bit lines, adjacent to said third pair of bit lines and extending substantially parallel to said first pair of bit lines;

said second pair of bit lines being located between said first and third pairs of bit lines, said third pair of bit lines being located between said second and fourth pairs of bit lines;

a third sense amplifier coupled to said third pair of bit lines;

a fourth sense amplifier coupled to said fourth pair of bit lines;

a third pair of transfer transistors connecting said third pair of bit lines with said second pair of data bus lines;

a fourth pair of transfer transistor connecting said fourth pair of bit lines with said second pair of data bus lines;

said third and fourth pairs of transfer transistors being located between said third and fourth pairs of bit lines.

8. The device according to claim 7 further comprising first and second column lines, said first column line being coupled to said first and third pairs of transfer transistors and driving said first and third pairs of transfer transistors, said second column line being coupled to said second and fourth pairs of transfer transistors and driving said second and fourth pairs of transfer transistors.

9. A semiconductor memory device formed on and in a semiconductor substrate having a major surface, comprising:

a first pair of data bus lines, formed over said major surface and extending in a first direction;

a first pair of bit lines, formed over a first region in said major surface and extending in a second direction substantially perpendicular to said first direction;

a second pair of bit lines, adjacent to said first pair of bit lines and formed over a second region in said major surface and extending substantially parallel to said first pair of bit lines;

a first sense amplifier coupled to said first pair of bit lines;

a second sense amplifier coupled to said second pair of bit lines;

a first pair of transfer transistors connecting said first pair of bit lines with said first pair of data bus lines, said first pair of transfer transistors having first and second transistors;

a second pair of transfer transistors connecting said second pair of bit lines with said first pair of data bus lines, said second pair of transfer transistors having third and fourth transistors;

said first, second, third and fourth transistors each having first and second electrodes, the first electrodes of said first and second transistors being respectively coupled to said first pair of bit lines, the second electrodes of said third and fourth transistors being respectively coupled to said second pair of bit lines, the second electrodes of said first and second transistors being respectively connected to the first electrodes of said third and fourth transistors through first and second nodes; and said first and second pairs of transfer transistors being located between said first and second pairs of bit lines.

10. The device according to claim 9 wherein said first pair of data bus lines includes first and second data bus lines which are substantially parallel to each other, said first data bus line being connected to said first node connecting the second electrode of said first transistor and the first electrode of said third transistor, and said second data bus line being connected to said second node connecting the second electrode of said second transistor and the first electrode of said fourth transistor.

11. The device according to claim 10 wherein the second electrode of said first transistor, the first node, and the first electrode of said third transistor are formed by a first common diffusion region in the major surface; and the second electrode of said second transistor, the second node, and the first electrode of said fourth transistor are formed by a second common diffusion region in the major surface;

said first and second common diffusion regions being located between the first and second regions in the major surface;

said first common diffusion region extending beneath said first data bus line; and said second common diffusion region extending beneath said second data bus line.

12. The device according to claim 11 wherein said first common diffusion region is connected to said first data bus line through a first metal contact; and said second common diffusion region is connected to said second data bus line through a second metal contact.

13. The device according to claim 11 further comprising first and second column lines; said first column line being coupled to said first pair of transfer transistors and driving said first pair of transfer transistors; said second column line being coupled to said second pair of transfer transistors and driving said second pair of transfer transistor.

14. The device according to claim 13 wherein said first and second column lines respectively extend substantially parallel to said first pair of bit lines.

15. The device according to claim 11 wherein said first and second sense amplifiers and said first and second pairs of transfer transistors are located between said first and second data bus lines.

16. The device according to claim 11 wherein said first and second pairs of transfer transistors are located between said first and second sense amplifiers.

17. The device according to claim 11 further comprising:

a second pair of data bus lines extending substantially parallel to said first pair of data bus lines;

a third pair of bit lines extending substantially parallel to said first pair of bit lines;

a fourth pair of bit lines, adjacent to said third pair of bit lines and extending substantially parallel to said first pair of bit lines;

said second pair of bit lines being located between said first and third pairs of bit lines, said third pair of bit lines being located between said second and fourth pairs of bit lines;

a third sense amplifier coupled to said third pair of bit lines;

a fourth sense amplifier coupled to said fourth pair of bit lines;

a third pair of transfer transistors connecting said third pair of bit lines with said second pair of data bus lines; and a fourth pair of transfer transistors connecting said fourth pair if bit lines with said second pair of data bus lines;

said third and fourth pairs of transfer transistors being located between said third and fourth pairs of bit lines.

18. The device according to claim 17 further comprising first and second column lines; said first column line being coupled to said first and third pairs of transfer transistors and driving said first and third pairs of transfer transistors; said second column line being coupled to said second and fourth pairs of transfer transistors and driving said second and fourth pairs of transfer transistors.

* * * * *